United States Patent [19]

Shinoda et al.

[11] Patent Number: 5,018,109

[45] Date of Patent: May 21, 1991

[54] MEMORY INCLUDING ADDRESS REGISTERS FOR INCREASING ACCESS SPEED TO THE MEMORY

[75] Inventors: Takashi Shinoda; Masamichi Ishihara, both of Tokyo, Japan

[73] Assignee: Hitachi, Ltd., Tokyo, Japan

[21] Appl. No.: 465,890

[22] Filed: Jan. 16, 1990

Related U.S. Application Data

[63] Continuation of Ser. No. 144,066, Jan. 15, 1988, Pat. No. 4,912,679.

[30] Foreign Application Priority Data

Jan. 16, 1987 [JP] Japan ................................ 62-5981

[51] Int. Cl.$^5$ .................... G11C 7/00; G11C 8/00; G11C 11/407
[52] U.S. Cl. .................... 365/230.08; 365/189.05; 365/233
[58] Field of Search ............. 365/233, 233.5, 230.01, 365/230.08, 195, 189.05

[56] References Cited

U.S. PATENT DOCUMENTS

| | | | |
|---|---|---|---|
| 4,630,239 | 12/1986 | Reed et al. ...................... | 365/233.5 |
| 4,803,665 | 2/1987 | Kasa ............................... | 365/233.5 |
| 4,912,679 | 3/1990 | Shinoda et al. ................. | 365/233.5 X |

*Primary Examiner*—Alyssa H. Bowler
*Attorney, Agent, or Firm*—Antonelli, Terry, Stout & Kraus

[57] ABSTRACT

A microprocessor or the like supplies address signals for memory access according to its own operation speed irrespective of operation speed of a memory. A plurality of registers which take a plurality of address signals inputted in asynchronous state are installed in the memory. The memory access is performed according to sequence of the address signals taken in these plural registers.

5 Claims, 4 Drawing Sheets

MEMORY INCLUDING ADDRESS REGISTERS FOR INCREASING ACCESS SPEED TO THE MEMORY

This is a continuation application of Ser. No. 144,066 filed Jan. 15, 1988 now U.S. Pat. No. 4,912,679.

BACKGROUND OF THE INVENTION

The present invention relates to memories, and, for example, to effective technology to be utilized in a semiconductor integrated circuit device such as a buffer memory used in data transmission.

In a dynamic type RAM (random access memory) or a static type RAM, memory access is performed in synchronization with an external signal such as substantial chip selective signal and address signal. Regarding such dynamic type RAM or static type RAM, description is, for example, in "Hitachi IC memory data book" published by Hitachi, Ltd. in September 1985.

In the above-mentioned dynamic type RAM or static type RAM, the memory access speed is restricted by the external signal as above described. Consequently, when the memory access is performed from a microprocessor or the like with different memory access speed, the bit rate is determined by slower operation speed.

SUMMARY OF THE INVENTION

An object of the invention is to provide a memory which realizes efficient memory access.

The foregoing and other objects and novel features of the invention will be apparent from the description of the specification and the accompanying drawings.

An outline of the present invention disclosed in the application will be briefly described as follows. That is, a plurality of registers are installed to take a plurality of address signals inputted in an asynchronous state, and the memory access is performed according to a sequence of the address signals output from the plurality of registers.

According to the above-mentioned apparatus, a microprocessor or the like may perform a memory access by supplying address signals to the plurality of registers for the memory access according to its own operation speed irrespective of the operation speed of the memory. Consequently, since the memory can output data according to the address signals obtained from the plurality of registers and to its own operation speed, efficient memory access can be realized.

DESCRIPTION OF THE PREFERRED EMBODIMENTS

Figure 1:
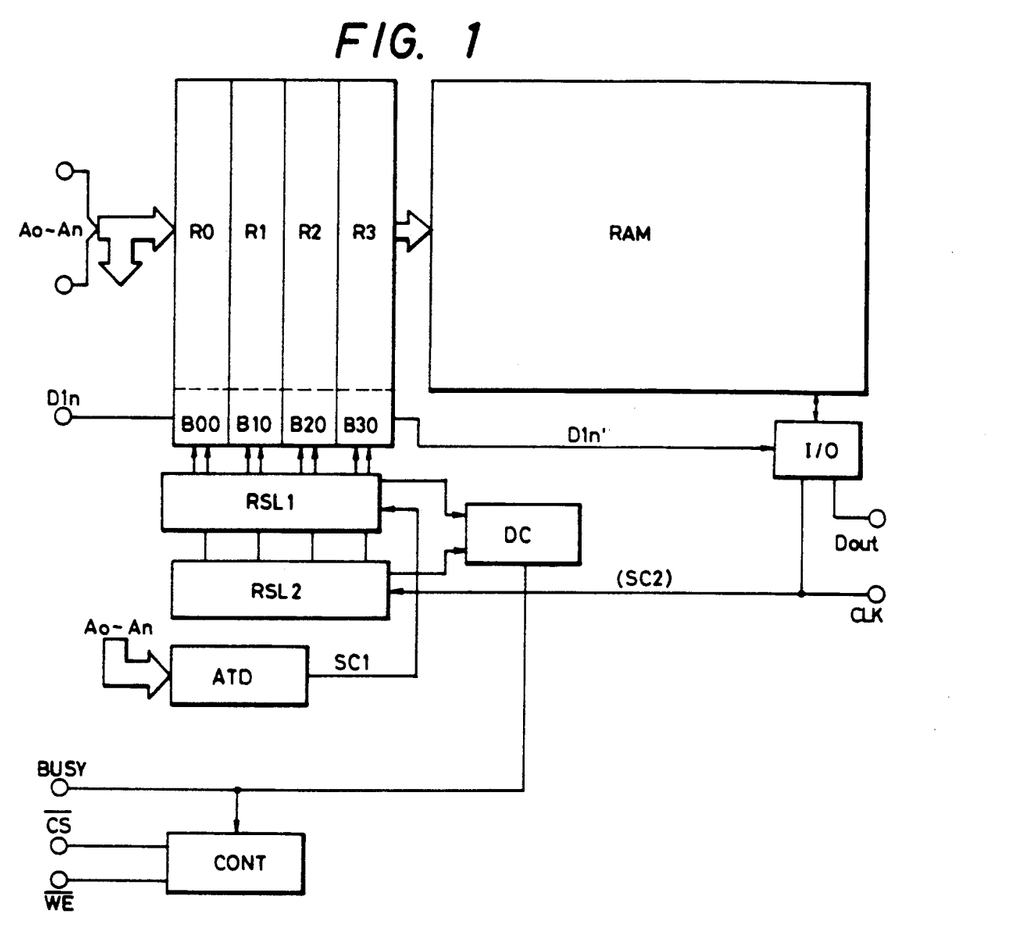
FIG. 1 is a block diagram illustrating an embodiment of the invention.

FIG. 1 shows a block diagram of a semiconductor memory as an embodiment of the invention.

Each circuit block in FIG. 1 is formed by known semiconductor manufacturing technology on one semiconductor substrate such as monocrystalline silicon although not particularly limited thereto.

In this embodiment, irrespective of the inner operation speed of the memory, in other words, in order to enable input of address signals and write data in the asynchronous state, a plurality of registers R0 through R3 are installed.

For example, when the memory access is performed in a unit of one bit, among each of registers R0 through R3, one bit of either B00 through B30 is used for the write data and residual bits are assigned corresponding to the address signals A0~An.

In order to input address signals to the above-mentioned registers R0 through R3 and data to the above-mentioned bits B00 through B30 in the case of write mode in asynchronous state, an address signal variation detector ATD is installed although not particularly limited thereto. The address signal variation detector ATD receives addresses A0 through An from an external terminal, and if any one address among them is varied the address signal variation detector ATD detects it and forms a timing signal SC1.

The timing signal SC1 is supplied to a register selective circuit RSL1 which forms selective signals of the above-mentioned registers R0 through R3. Thereby the register selective circuit RSL1 detects a supply of the selective signals and changes the registers R0 through R3 to be selected. The above-mentioned register selective circuit RSL1 is constituted by shift registers for example, and performs the shift operation using the above-mentioned timing signal SC1 as a clock and thereby forms selective signals of the registers R0 through R3. The register selective circuit RSL1 may be constituted by a count circuit and a decoder circuit in place of the above-mentioned shift registers. That is, the count circuit receives the timing signal SC1 and performs step operation, and the decoder circuit may decode the step output and select one register in sequence.

Thus address signals for the memory access from outside and write data corresponding thereto can be supplied in sequence according to the speed of a microprocessor or the like as a signal source irrespective of operation of an internal circuit.

The RAM is a memory circuit and constituted by a dynamic type RAM or a static type RAM for example. However, since the address signals are taken in the registers R0 through R3 as above described, an address buffer becomes unnecessary and the RAM is constituted by a memory array and a selective circuit of a decoder or the like.

A control circuit CONT performs control of taking of the address signals or control of access to the memory circuit RAM. The control circuit CONT receives chip selective signal $\overline{CS}$ and write enable signal $\overline{WE}$ for example, and discriminates the operation mode and generates a timing signal necessary for the operation. If the chip selective signal $\overline{CS}$ is made low level, the control circuit CONT makes the address signal variation detector ATD or the register selective circuit RSL1 or the like in operation state so as to enable taking of address signals as above described. If the write enable signal $\overline{WE}$ is low level, write operation is judged; if the write enable signal $\overline{WE}$ is high level, read operation is judged. When the read mode is judged data of an external terminal Din is made ineffective, and when the write mode is judged write signal supplied from the external terminal Din is made effective.

If the control circuit CONT detects taking of the address signal to the register R0 for example, it generates timing signal necessary for access to the memory circuit RAM. Operation of the memory circuit RAM is performed at optimum speed corresponding to its capacity. For example, at the read mode, timing signal to make an output circuit of an input/output circuit I/O in operation state at data outputting from an external terminal $D_{out}$ by the read operation is outputted as synchronous signal CLK of data output to outside. The synchronous signal CLK is supplied also to a register selective circuit RSL2. Thereby the register selective circuit RSL2 detects ending of the memory access, and changes the registers R0 through R3 to be selected. The above-mentioned register selective circuit RSL2 is constituted, for example, by shift registers in similar manner to the register selective circuit RSL1, and performs shift operation using the synchronous signal CLK (SC2) as clock thereby forms selective signals of the registers R0 through R3 in sequence. The register selective circuit RSL2 may be constituted by a count circuit and a decoder circuit in place of the shift registers as above described. That is, the count circuit receives the timing signal SC2 and performs step operation, and the decoder circuit may decode the step output and select one register in sequence.

On the other hand, at the write mode, timing signal to make an input circuit of the input/output circuit I/O in operation state when writing is performed by write data taken in a register assigned at the write operation is supplied to the register selective circuit RSL2. Thereby the register selective circuit detects ending of the write operation, and changes the registers R0 through R3 to be selected.

In the memory access to the above-mentioned memory circuit RAM, in order to make the operation high speed, address arithmetic function is added. That is, since the address signals are supplied to the registers R0 through R3 as above described, address signal used in memory access proceeding by one and address signal to perform memory access subsequently are compared and estimated. For example, when memory cells coupled to the same word line are selected, selective operation of the word line is omitted, in other words, selective state of the word line in the memory access preceeding by one is maintained and column selective operation is only performed. Such address arithmetic function is contained in the address decoder circuit or the control circuit CONT within the memory circuit RAM for example.

In this embodiment, supply of the address signals to the registers R0 through R3 and access operation of the memory circuit RAM by the taken address signals are performed concurrently. In such concurrent operation, if supply of the address signal is rapid, contention occurs between a register to which the address signal is to be supplied and a register to be used in the access of the memory circuit RAM. On the contrary, if the memory access of the memory circuit RAM is rapid, contention occurs to a register to be used in the supply of the address signal. In order to eliminate such contention, a comparator DC is installed. The comparator DC receives output signals of the register selective circuits RSL1 and RSL2, and if contention of selection occurs to the same register, busy signal BUSY is transmitted from an external terminal to the control circuit CONT. If the busy signal BUSY is transmitted, the control circuit CONT interrupts the address supply operation from outside or the access of the memory circuit RAM.

Figure 2:
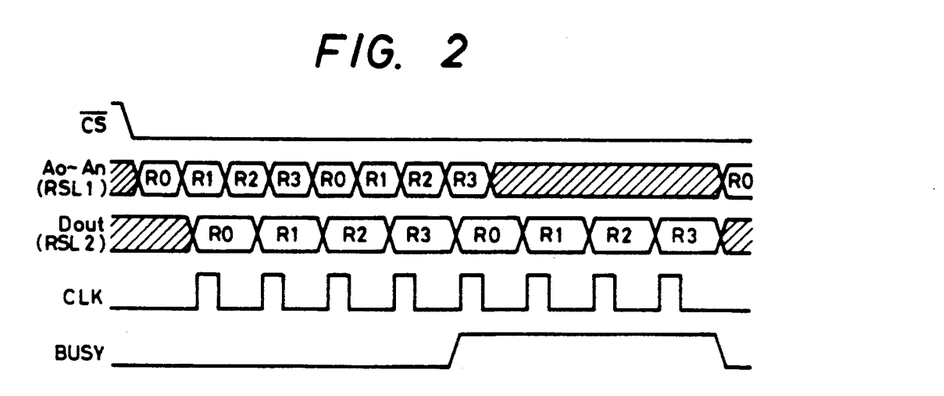
FIG. 2 is a timing chart illustrating an example of operation of the embodiment.

FIG. 2 shows a timing chart illustrating an example of operation of the above-mentioned semiconductor memory. FIG. 2 shows operation where the address supply operation from an external device such as a microprocessor is more rapid than the operation of the memory circuit RAM.

The semiconductor device is made in operation state, if the chip selective signal $\overline{CS}$ is made low level.

The microprocessor supplies address signals A0~An corresponding to the operation speed. In the above-mentioned chip selective state, the address selective circuit RSL1 assigns the register R0. Consequently, the address signals A0~An first supplied are taken in the register Ro, and the address signals A0~An subsequently supplied are taken in sequence of the registers R1, R2, R3 respectively. Changing of the registers R0 through R3 for such address signal taking is performed by the operation of the register selective circuit RSL1 which receives the step pulse SC1 formed by the address signal variation detector ATD. That is, the register selective circuit RSL1 forms selective signals of a switch circuit installed in input of each of registers R0 through R3 in sequence according to the step pulse SC1.

If the control circuit CONT detects the supply operation of the address signal to the register R0, it assigns the register R0 by the register selective circuit RSL2 and starts the access of the memory circuit RAM. In this memory access, if it is write operation, since the address signal is supplied and at the same time corresponding write signal is held in specific bit B00~B30 of each of registers R0 through R3, the write signal Din' is taken out by assignment of a register by the register selective circuit RSL2 and then written through the input/output circuit I/O into a selected memory cell. If it is read operation, memory information of the memory cell selected by the address signal passes through the input/output circuit I/O and is outputted from the external terminal $D_{out}$ in synchronization with the clock signal CLK.

When the address supply operation is more rapid than the memory access operation as above described, for example, in the access of the memory circuit RAM by the address signal held in the register R0 at the second round as shown in FIG. 2, contention occurs with the supply operation of new address signal to the register R0. In the address supply to the register R3, if the comparator DC detects that the memory access by the register R0 is not ended, it transmits the busy signal BUSY out of the external terminal. Thereby stop of the address supply operation is commanded to the microprocessor.

In this embodiment, if the supply operation of the address signal to the register R0 is allowed by the ending of the memory access by the address signal taken in the register Ro, in later operation, the supply operation of new address signal is performed in synchronization with the memory access operation of the memory circuit RAM substantially. Consequently, the high speed operation of the microprocessor is restricted by the memory access time of the memory circuit RAM. In this case, once contention of the register occurs as above described, the busy signal is transmitted out of the external terminal by the address signals taken in all residual registers until the memory access of the memory circuit RAM is ended, in other words, until all registers R0 through R3 become empty state substantially. During transmission of the busy signal, the microprocessor can perform other information processing operation.

When all registers R0 through R3 become empty state, transmission of the busy signal BUSY is stopped and the address supply from the microprocessor is started again. In later process, the memory access is performed by similar operation. In this embodiment, since the address supply operation and the operation of the memory circuit RAM are performed independently in asynchronous state, the memory access can be performed corresponding to respective operation speed.

On the contrary to the above-mentioned case, when the address supply operation of the microprocessor is slower than the memory access of the memory circuit RAM, after the taking of address signals is ended, the access of the memory circuit RAM is started. Changing of the access start timing to such memory circuit RAM can be performed by supplying prescribed control signal from the external terminal.

In order to avoid the contention of the register, the access start of the memory circuit RAM may be delayed until the taking of address is performed to all registers. After the memory access according to the address signals taken in all registers R0 through R3 is ended, the supply of the address signals may be allowed again. In this case, the contention of the register can be eliminated by a simple circuit.

Figure 3:
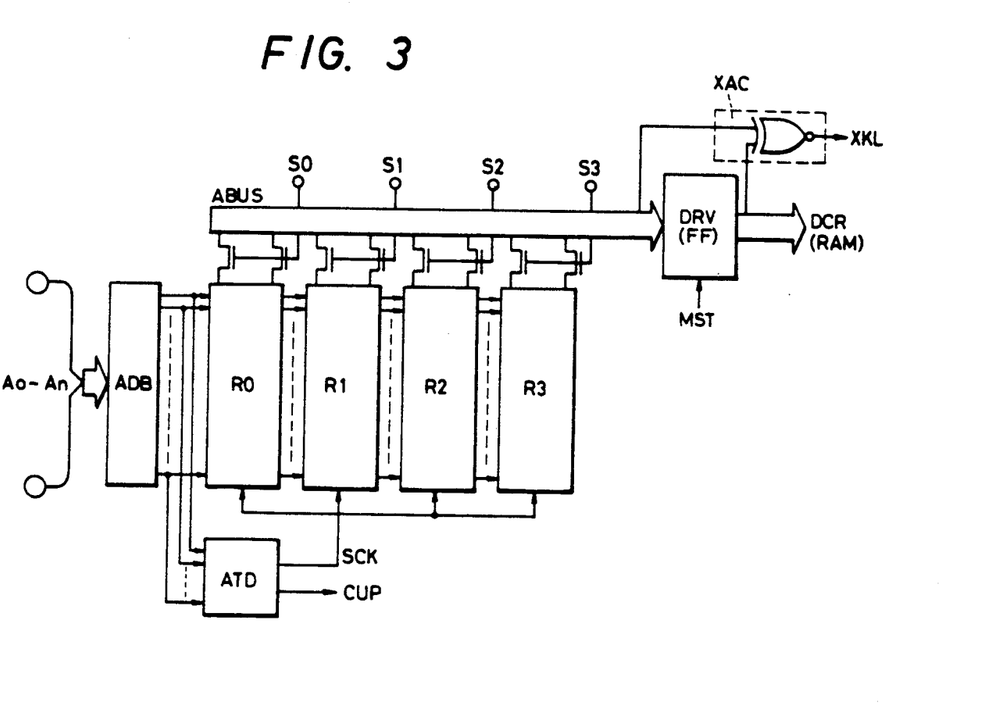
FIG. 3 is a block diagram illustrating an embodiment of a register circuit shown in FIG. 1.

FIG. 3 shows a block diagram of the registers R0 through R3 to take address signals and a specific example of an output circuit thereof.

Figure 4:
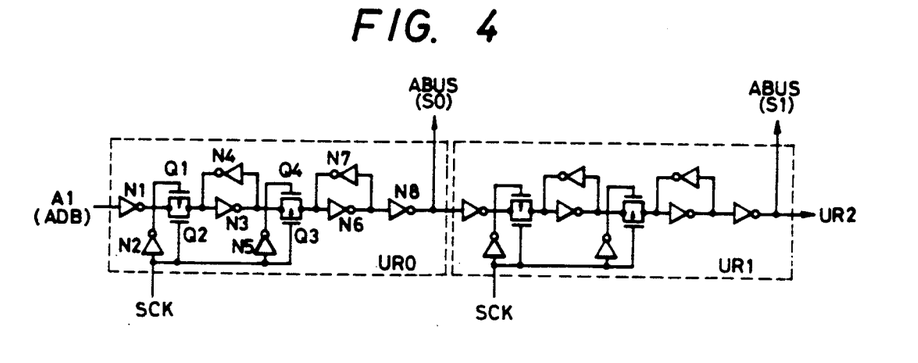
FIG. 4 is a circuit diagram illustrating a specific example of the register circuit.

In this embodiment, between corresponding bits of the four registers R0 through R3, shift registers to perform serial transfer of corresponding address signals are constituted. FIG. 4 shows a circuit diagram of a specific example of the shift register. In FIG. 4, unit circuits UR0 and UR1 of the registers R0 and R1 corresponding to address signal Ai of one bit are exemplified as representative. In FIG. 4, each circuit is constituted by a CMOS (complementary MOS) circuit comprising N-channel MOSFET and P-channel MOSFET. The P-channel MOSFET is distinguished from the N-channel MOSFET by adding arrow to its channel (back gate) portion. This is similar also in FIG. 6 as hereinafter described.

The unit circuit UR0 of the register R0 is composed of an input stage circuit and an output stage circuit. The input stage circuit comprises an input inverter circuit N1, an input circuit including P-channel MOSFET Q1 and N-channel MOSFET Q2 to constitute a CMOS switch circuit installed at output of the inverter circuit N1, and a latch circuit including inverter circuits N3 and N4 with its input and output in cross connection. In the feedback inverter circuit N4 to constitute the latch circuit, if conductance of P-channel MOSFET and N-channel MOSFET to constitute the inverter circuit N4 is made small in comparison to that of the input inverter circuit N1, output of the inverter circuit N4 is varied corresponding to output signal of the inverter circuit N1. In place of this constitution, a CMOS switch circuit similar to the above description may be installed at output side of the feedback inverter circuit N4, or the inverter circuit N4 may be constituted in a clock inverter so that the inverter circuit N4 is operated complementarily to the CMOS switch circuit (Q1 and Q2) corresponding to shift clock SCK.

The output stage circuit comprises a CMOS switch circuit including N-channel MOSFET Q3 and P-channel MOSFET Q4 to receive output signal of the inverter circuit N3 in similar manner to the above description, a latch circuit including inverter circuits N6 and N7 to receive signals through the CMOS switch circuit (Q3, Q4), and an output inverter circuit N8 to receive output signal of the inverter circuit N6 being output of the latch circuit. The feedback inverter circuit N7 to constitute the latch circuit has the output drive capacity being set small in comparison to the inverter circuit N3 in similar manner to the feedback inverter circuit N4 in the input stage circuit. In place of this constitution, a CMOS switch circuit similar to the above description may be installed at output side of the feedback inverter circuit N7, or the inverter circuit N7 may be constituted in a clock inverter so that the inverter circuit N7 is operated complementarily to the CMOS switch circuit (Q3 and Q4) corresponding to shift clock SCK.

Shift clock SCK is supplied to gate of the N-channel MOSFET Q2 of the CMOS switch circuit to constitute the input stage circuit, and the shift clock SCK is supplied to gate of the P-channel MOSFET Q1 through an inverter circuit N2. On the contrary, since the CMOS switch circuit to constitute the output stage circuit is operated complementarily to the CMOS switch circuit of the input stage circuit, in reverse to the above case, shift clock SCK is supplied to gate of the P-channel MOSFET Q3, and the shift clock SCK is supplied to gate of the N-channel MOSFET Q4 through an inverter circuit N5.

Output signal of the register R0 is transmitted to input of an input inverter circuit of corresponding unit circuit UR1 to constitute the register R1. Since the unit circuit UR1 is constituted by the same circuits as that in the unit circuit UR0, the circuit symbol is omitted in FIG. 4. Unit circuits in residual registers R2 and R3 are constituted in similar manner to the above description, and circuits corresponding to the address signal Ai are connected in cascade form so as to constitute a shift register.

When the shift clock SCK is at high level, the CMOS switch circuit of the input stage circuit in each of the unit circuits UR0 and UR1 as above exemplified is turned on, and the CMOS switch circuit of the output stage circuit is turned off. Consequently, address signal Ai inputted through an address buffer ADB passes through the inverter circuit N1 and the CMOS switch circuit (Q1 and Q2) at ON state and then is taken in the latch circuit comprising the inverter circuits N3 and N4. Since the CMOS switch circuit (Q3 and Q4) of the output stage circuit is turned off then, it holds the address signals previously taken and the held address signals are transferred to the latch circuit of the input stage circuit of the unit circuit UR1. Also in respective unit circuits in the registers R2 and R3 (not shown), address signals held in the output stage circuit of the register R1 are transferred to the latch circuit of the input stage circuit of the register R2, and address signals held in the output stage circuit of the register R2 are transferred to the latch circuit of the input stage circuit of the register R3. In this constitution, when the shift clock is at high level, transfer operation of half bit is performed.

If the shift clock SCK is varied from high level into low level, the CMOS switch switch circuit of the input stage circuit in each unit circuit is turned off, and the CMOS switch circuit of the output stage circuit is turned on. In the unit circuit UR0 as exemplified, when the CMOS switch circuit (Q3, Q4) in the output stage is turned on, address signals Ai taken in the latch circuit (N3, N4) of the input stage circuit are transferred to the latch circuit (N6, N7) of the output stage circuit. This applies also to other unit circuits, and shift operation of one bit is performed. That is, new address signals are taken in the register R0. Address signals held in the register R0 are taken in next register R1, and address signals held in the register R1 are taken in next register R2, and further address signals held in the register R2 are taken in next register R3. Address signals held in the register R3 disappear by the transfer operation of one bit as above described. The above-mentioned constitution is similar in the bits B00 through B30 corresponding to the write data shown in FIG. 1.

This is described using FIG. 3 as follows. Address signals A0~An supplied from the external terminal are supplied through the address buffer ADB to the register R0 at initial stage. The address signals taken in the register R0 is outputted on one hand to an address bus ABUS through a switch circuit shown by MOSFET as exemplified. The address signals taken in the above-mentioned register R0 are transmitted on the other hand to input of the register R1 at next stage. The address signals taken in the register R1 are outputted to the address bus ABUS through a switch circuit shown by MOSFET. The address signals taken in the above-mentioned register R1 are transmitted on the other hand to input of the register R2 at next stage. Subsequently in similar manner, the address signals taken in the above-mentioned register R2 are outputted to the address bus ABUS through a switch circuit, and transmitted to input of the register R3 at next stage. The shift clock SCK is supplied to each of the registers R0~R3. Thereby the address signals supplied from the address buffer ADB are shifted and transmitted in sequence to the registers R0, R1, R2 and R3 in synchronization with the shift clock SCK. In this constitution, the address signals taken in the register R3 at last stage are swept out by the shift operation and disappear.

The switch circuit installed corresponding to each of the registers R0 through R3 is supplied with the selective signals S0~S3. Thereby the address signals taken to each of the registers R0~R3 are outputted to the address bus ABUS in an alternative way according to the selective signals S0~S3.

Address signals outputted from the address bufer ADB are supplied also to the address signal variation detector ATD. If any one of the address signals A0~An is varied, the address signal variation detector ATD detects the variation and generates the shift clock SCK. The address signal variation detector ATD also generates count up signal CUP based on the shift clock SCK. The count up signal CUP is made pulse generated after the shift operation of one bit according to the shift clock SCK is ended although not particularly limited thereto.

The address signals outputted to the address bus ABUS are transmitted through a drive circuit DRV to a decoder DCR of a memory circuit RAM. In this embodiment, the drive circuit DRV has a latch circuit FF. The latch circuit FF holds address signals inputted through the address bus ABUS according to start signal MST supplied from the memory circuit RAM.

In this embodiment, in order to realize the high speed access of the memory circuit RAM, an address comparator XAC is installed which receives address signals of X series among the address signals supplied from the address bus ABUS, and corresponding address signals of X series held in the drive circuit DRV. The address comparator XAC is composed of an exclusive-OR circuit which receives corresponding address signals among the address signals of X series in plural bits, and an AND circuit which receives coincidence signals thereof. In FIG. 3, one exclusive-OR circuit is exemplified as representative. If the address signals are coincident, killer signal XKL is formed so as to omit the selective operation of X series in the memory circuit RAM. If the signal XKL is formed, the memory circuit RAM maintains the selective operation of X series as it is, and its access operation becomes the selective operation of Y series only.

Figure 5:
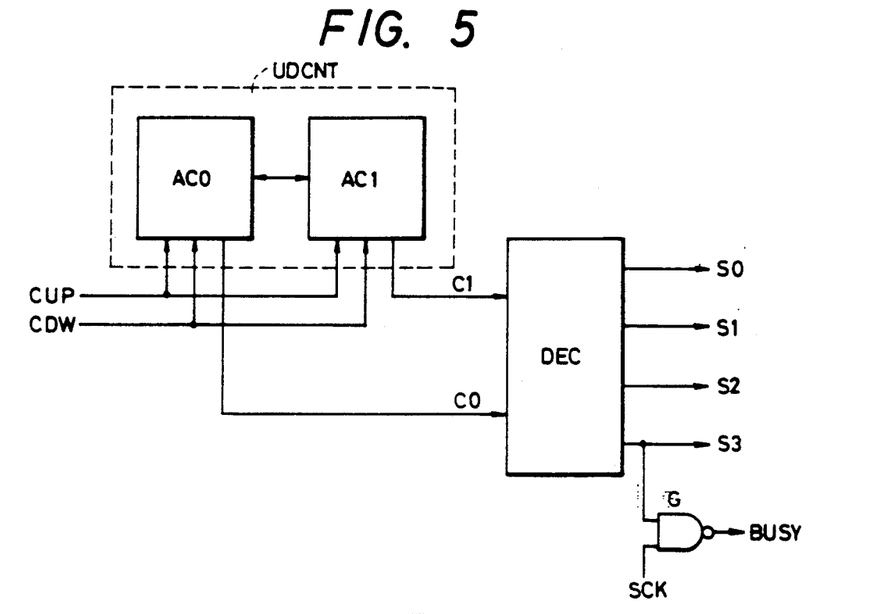
FIG. 5 is a block diagram illustrating an embodiment of a register selective circuit corresponding to the register in FIG. 3.

FIG. 5 shows a block diagram of a specific example of a register selective circuit corresponding to the register shown in FIG. 4.

In this embodiment, the register selective circuit is constituted by combination of a counter circuit and a decoder circuit. The register selective circuit of this embodiment has both functions in the two register selective circuits SEL1 and SEL2 shown in FIG. 1. That is, the counter circuit UDCNT comprises unit counter circuits AC0 and AC1, and performs the count operation of up/down of two bits. The counter circuit UDCNT performs the up count operation of +1 by count up signal CUP, and performs the down count operation of −1 by count down signal CDW. Output signals C0 and C1 of respective unit counter circuits AC0 and AC1 are supplied to the decoder circuit DEC. The decoder circuit DEC decodes the output signals C0 and C1 in two bits, and forms selective signals S0 through S3 assigned by any one register among the registers R0 through R3.

In this embodiment, in order to detect contention between the supply of the address signal to the register and the access operation of the memory circuit RAM, the selective signal S3 of the register R3 and the shift clock signal SCK are supplied to a NAND gate circuit G, and busy signal BUSY is outputted from output of the NAND gate circuit G. Although not shown, if the output signal BUSY of the NAND gate circuit G is transmitted from the external terminal as it is, since the supply of the address signal from outside and the memory access operation of the memory circuit RAM are performed substantially in synchronization as above described, the flipflop circuit is set by this signal BUSY and the set output signal is transmitted as the busy signal BUSY to the external terminal. The flipflop circuit is reset using the selective signal S0. In this constitution, after all registers R0 through R3 become empty state, the supply of new address signals may be started.

The register selective operation of the embodiment is as follows.

The counter circuit UDCNT is at reset state when chip selective signal $\overline{CS}$ is high level, and it starts the count operation when the signal $\overline{CS}$ is low level.

For example, if the chip selective signal $\overline{CS}$ is varied from high level into low level and the first address is supplied, corresponding to this, the address signal variation detector ATD generates the shift clock SCK. Thereby the first address signal is taken in the shift register R0.

The memory circuit RAM receives the shift clock SCK as hereinafter described, and starts the operation and generates the start signal MST. Thereby the decoder circuit DEC makes the selective signal S0 high level, since both count outputs C0 and C1 are low level (logic "0"). Consequently, address signals taken in the register R0 are transmitted through the switch circuit to the address bus ABUS. The address signals transmitted to the address bus ABUS are supplied through the drive circuit DRV to the memory circuit RAM. When the address signal variation detector ATD detects variation of the first address signal supplied after the chip selective signal $\overline{CS}$ is made from high level into low level, it does not generate the count up signal CUP.

At the midway that the memory circuit RAM is performing the operation, if next address signal is supplied, since the the address signal variation detector ATD generates the shift clock SCK, new address signal is taken in the register R0 and the address signal taken in the register R0 is transferred to the register R1. According to the shift clock SCK, the address signal variation detector ATD generates the count up signal CUP. Thereby the counter circuit UDCNT performs the count operation of +1.

Thereby since the count outputs C1, C0 become (01), the decoder DEC during operation forms selective signal S1. Consequently the first address signal transferred to the register R1 is transmitted to the address bus ABUS. Since the drive circuit DRV has the latch circuit FF, it holds the address signal first transmitted irrespective of the switch changing as above described.

If next address signal is supplied again before the ending of the operation of the memory circuit RAM, since the address signal variation detector ATD generates the shift clock SCK, new address signal is taken in the register R0, and the address signal taken in the register R0 is transferred to the register R1, and further the address signal taken in the register R1 is transferred to the register R2. According to the shift clock SCK, the address signal variation detector ATD generates the count up signal CUP. Thereby the counter circuit UDCNT performs the count operation of +1. Since the count outputs C1, C0 become (10), the decoder DEC during operation forms selective signal S2. Consequently the first address signal transferred to the register R2 is transmitted to the address bus ABUS.

If the operation of the memory circuit RAM according to the address signal first supplied is ended, the memory circuit RAM generates end signal MEN and count down signal CDW. Thereby the counter circuit UDCNT performs the count operation of −1. Thereby the count outputs C1, C0 become (01). The memory circuit RAM generates start signal SMT at a definite period after the end signal MED. This period is to secure the reset period of the memory selective circuit. If new address signal is not supplied during this period, the decoder circuit DEC generates the selective signal S1 which decodes (01) of the count outputs C1, C0. Thereby the second supplied address signal taken in the register R1 is transmitted through the address bus ABUS to the drive circuit DVR, and held in synchronization with the start signal MST and also transmitted to the address decoder circuit of the memory circuit RAM so as to start the memory access again.

If new address signal is supplied during the reset period of the memory selective circuit, the shift operation of one bit is performed in the registers R0 through R3, and the counter circuit UDCNT performs the count operation of +1. Thereby the address signal to access the memory circuit RAM next according to coming of the start signal MST is taken from the register R2.

While the access of the memory circuit RAM is performed according to the address signal taken in the register R3, in other words, while the selective signal S3 is high level, if new address signal is supplied and therefore the shift clock SCK is generated, the busy state is detected by the NAND gate circuit G and the busy signal is transmitted. Also in this case, taking of the address signal and the shift operation are performed. Consequently the address signal performing the access of the memory circuit RAM disappears but is held in the drive circuit DVR, thereby the memory operation is not affected.

If the end signal MED is formed, the counter circuit UDCNT performs the count operation of −1, and the decoder circuit DEC assigns the register which stores address signal to access the memory circuit RAM next and transmits the address signal to the address bus ABUS. The address comparator XAC compares previous address signal held in the latch circuit FF of the drive circuit DVR with next address signal to be transmitted to the address bus ABUS, and detects coincidence/uncoincidence. If they are coincident, killer signal XKL is generated. Thereby the reset operation of X series is made ineffective by the end signal MED, and the word line maintains selective state. Consequently the selective operation of Y series only is performed at next memory access. That is, if the killer signal XKL is generated, the memory circuit RAM omits the selective operation of the word line, and immediately starts the selective operation of data line (bit line or digit line). Thereby high speed operation of the memory circuit RAM becomes possible.

Figure 6:
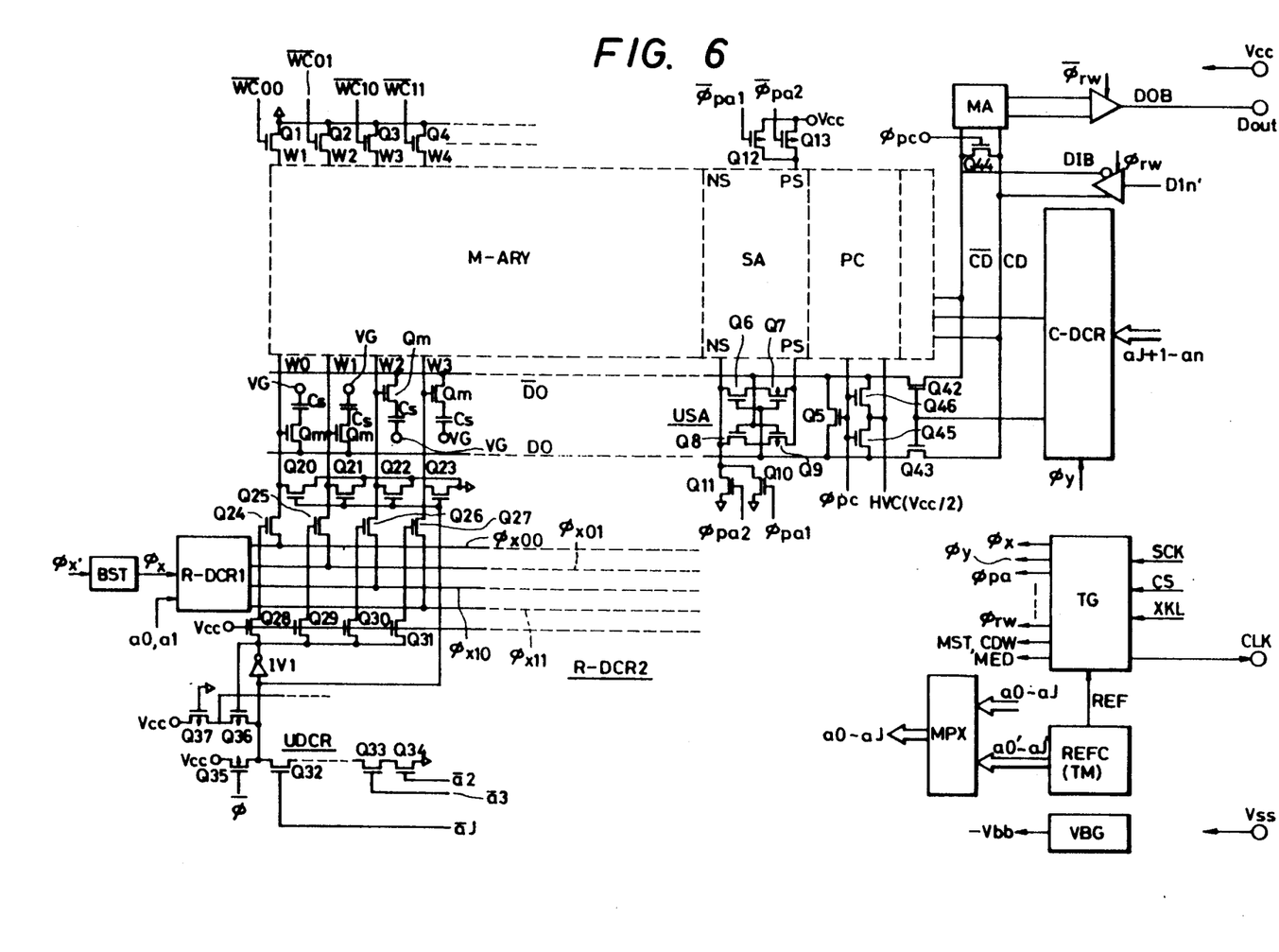
FIG. 6 is a specific circuit diagram illustrating an embodiment of a memory circuit.

FIG. 6 shows a specific circuit diagram of an embodiment where a dynamic type RAM is used as a memory circuit RAM. Each circuit element in FIG. 6 together with a circuit element to constitute the above-mentioned registor or the like can be formed by manufacturing technology of known MOS integrated circuit, for example, on one semiconductor substrate such as monocrystalline silicon. Although circuit symbol designated to MOSFET in FIG. 6 is partly overlapped with that of MOSFET in FIG. 4, it should be understood that both are different in circuit function.

Although not particularly limited, integrated circuit is formed on a semiconductor substrate of monocrystalline P-type silicon. N-channel MOSFET is formed on a surface of such semiconductor substrate, and composed of source region, drain region, and gate electrode of polysilicon formed on the surface of the semiconductor substrate between the source region and the drain region through a thin gate insulation film. P-channel MOSFET is formed in N-type well region formed on the surface of the semiconductor substrate. Thereby the semiconductor substrate constitutes the common substrate gate for plural N-channel MOSFET formed thereon. N-type well region constitutes the substrate gate for P-channel MOSFET formed thereon. The substrate gate for the P-channel MOSFET, i.e., the N-type well region is coupled with a power source terminal Vcc. A substrate bias voltage generating circuit VBG generates negative back bias voltage −Vbb to be supplied to the semiconductor substrate. Thereby the back bias voltage is applied to the substrate gate of the N-channel MOSFET. As a result, parasitic capacitance value between source, drain and the substrate of the N-channel MOSFET is decreased thereby the circuit can be operated at high speed, and since minority carriers produced on the substrate are absorbed and loss of information charge stored in the information memory capacitor is reduced, the refresh period can be made long.

More concrete structure of integrated circuit will be broadly described as follows.

That is, among surface portion of a semiconductor substrate made of monocrystalline P-type silicon and having N-type well region formed thereon, except surface portion made an active region, in other words, except surface portion made a semiconductor wiring region, a capacitor forming region, and source, drain and a channel forming region (gate forming region) of N-channel and P-channel MOSFET, a field insulation film being relatively thick is formed by known selective oxidation method. On the capacitor forming region, although not particularly limited, a first polysilicon layer is formed through a relatively thin insulation film (oxide film). The first polysilicon layer is extended onto the field insulation film. On a surface of the first polysilicon layer is formed a thin oxide film by oxidation of itself. On the surface of the semiconductor substrate in the capacitor forming region, a channel is formed by N-type region formation by ion implantation method or by supplying prescribed voltage. Thereby a capacitor is constituted by the first polysilicon layer, the thin insulation film and the channel region. The first polysilicon layer on the field oxide film is deemed as a sort of wiring.

On the channel forming region, a second polysilicon layer to be made a gate electrode is formed through a thin gate oxide film. The second polysilicon layer is extended onto the field insulation film and the first polysilicon layer. Although not particularly limited, word line and dummy word line in a memory array as hereinafter described are constituted by the second polysilicon layer.

On the surface of the active region which is not covered by the field insulation film, the first and second polysilicon layers, source, drain and a semiconductor wiring region are formed by known impurity introducing method using it as an impurity introducing mask.

A relatively thick interlayer insulation film is formed on the surface of the semiconductor substrate including the first and second polysilicon layers, and a conductive layer of such as aluminium is formed on the interlayer insulation film. The conductive layer is coupled electrically with the polysilicon layer and the semiconductor region through a contact hole provided on an insulation film under the conductive layer. Although not particularly limited, data line in a memory array as hereinafter described is constituted by the conductive layer extended onto the interlayer insulation film.

The surface of the semiconductor substrate including the interlayer insulation film and the conductive layer is covered by a final passivation film such as composed of a silicon nitride film and a phosphosilicate glass film.

A memory array M-ARY is made two-intersection (turning bit line) system although not particularly limited thereto. FIG. 6 shows a pair of rows of the system concretely. On a pair of complementary data lines (bit line or digit line) D0, $\overline{D0}$ in parallel arrangement as exemplified, respective input/output nodes of a plurality of memory cells each composed of an address selective MOSFET Qm and an information storing capacitor Cs are distributed and coupled with definite regularity as shown in FIG. 6.

A precharge circuit PC is constituted by a switch MOSFET installed between the complementary data lines D0, $\overline{D0}$ as in MOSFET Q5 exemplified. The MOSFET Q5 is turned on at the non-acting state of the memory circuit RAM, because the precharge signal $\phi_{pc}$ generated at the non-acting state is supplied to gate of the MOSFET Q5. Thereby low level and high level of the complementary data lines D0, $\overline{D0}$ formed in the previous operation cycle by amplification action of a sense amplifier SA as hereinafter described are shortcircuited, and the complementary data lines D0, $\overline{D0}$ are supplied with the precharge voltage of about Vcc/2 (HVC). Although not particularly limited, when the memory circuit RAM is at non-acting state for a relatively long time, the precharge level is lowered by leak current or the like. Consequently in this embodiment, switch MOSFET Q45 and Q46 are installed so as to supply half precharge voltage HVC. A voltage generating circuit to form the half precharge voltage HVC may have relatively small current supply capacity to compensate the leak current or the like although a concrete circuit thereof is not shown. Thereby increase of the consumption power is suppressed.

Before the precharge MOSFET Q5 is turned on due to the non-acting state of the memory circuit RAM or the like, the sense amplifier SA is made non-acting state. Thereby the complementary data lines D0, $\overline{D0}$ hold the high level and low level at high impedance state. When the memory circuit RAM is made acting state, the precharge MOSFET Q5, Q45 and Q46 are turned off before the sense amplifier SA is made acting state. Thereby the complementary data lines D0, $\overline{D0}$ hold the half precharge level at high impedance state.

In such half precharge system, since the precharge level is formed by only shortcircuiting the high level and low level of the complementary data lines D0, $\overline{D0}$ the consumption power becomes low. In the amplification action of the sense amplifier SA, since the complementary data lines D0, $\overline{D0}$ are varied at common mode such as at high level and low level with respect to the precharge level, noise level generated due to the capacitance coupling can be reduced.

The sense amplifier SA with its unit circuit USA exemplified is constituted by a CMOS latch circuit comprising P-channel MOSFET Q7, Q9 and N-channel MOSFET Q6, Q8, and a pair of input/output nodes are coupled with the complementary data lines D0, $\overline{D0}$. Although not particularly limited, the latch circuit is provided with the power source voltage Vcc through P-channel MOSFET Q12, Q13 in parallel, and with the ground voltage Vss of the circuit through N-channel MOSFET Q10, Q11 in parallel. These power switch MOSFET Q10, Q11 and MOSFET Q12, Q13 are commonly used to a latch circuit (unit circuit) installed in other similar row within the same memory mat. In other words, the P-channel MOSFET and the N-channel MOSFET in latch circuits within the same memory mat are commonly connected respectively in source PS and NS.

Complementary timing pulses $\phi_{pal}$, $\overline{\phi}$pal to activate the sense amplifier SA at operation cycle are applied to gate of the MOSFET Q10, Q12, and complementary timing pulses $\phi$pa2, $\overline{\phi}$pa2 delayed from the timing pulses $\phi$pal, $\overline{\phi}$pal are applied to gate of the MOSFET Q11, Q13. In this constitution, operation of the sense amplifier SA is divided into two steps. When the timing pulses φpal, φ̄pal are generated, i.e., at the first step, small read voltage supplied between a pair of data lines from a memory cell is amplified without undesired level variation by current limiting function of the MOSFET Q10 and Q11 having relatively small conductance. If potential difference between the complementary data lines is increased by the amplification action in the sense amplifier SA and then the timing pulses φpa2, φ̄pa2 are generated, i.e., at the second step, the MOSFET Q12, Q13 having relatively large conductance are turned on. The amplification action of the sense amplifier SA is made rapid because of the turning-on state of the MOSFET Q12, Q13. Since the amplification action of the sense amplifier SA is performed at two steps as above described, undesired level variation of the complementary data lines is prevented and the data can be read at high speed.

A row decoder R-DCR is constituted by combination of row decoders R-DCR1 and R-DCR2 divided in two, although not particularly limited thereto. In FIG. 6, one circuit component (four word lines) of the second row decoder R-DCR2 is exemplified. According to the shown constitution, although not particularly limited thereto, address signals $\bar{a}2 \sim \bar{a}j$ are supplied to gate of N-channel type drive MOSFET Q32~Q34 in series. One shot pulse φ̄ temporarily made low level at the operation state is supplied to gate of P-channel type load MOSFET Q35. The one shot pulse φ̄ is made low level, for example, during period from formation of the start signal MST to indicate start of the memory access until generation of word line selective timing signal φ$_x$. *Consequently, the one shot pulse φ̄ is formed by a logic circuit to receive the timing signal. NAND gate circuit is constituted by the load MOSFET Q32 and the drive MOSFET Q32 ~Q34, and the word line selective signals corresponding to four lines are formed. Output of the NAND gate circuit is on one hand inverted by a CMOS inverter IV1, and transmitted through N-channel type cut MOSFET Q28~Q31 to gate of N-channel type transmission gate MOSFET Q24~Q27 as switch circuit. Since the NAND gate circuit performs dynamic operation in itself, next latch circuit is added thereto. Output signal of the CMOS inverter circuit IV1 is on the other hand fed back to gate of P-channel type second load MOSFET Q36 in parallel to the MOSFET Q35. Thereby when the output signal of the NAND gate circuit is made high level, since output signal of the CMOS inverter circuit IV1 is at low level, the second load MOSFET Q36 is turned on and the output signal is maintained at high level. If the output signal of the NAND gate circuit is low level, in other words, if all address signals $\bar{a}2 \sim \bar{a}j$ are high level and therefore all drive MOSFET Q32~Q34 are turned on, since the output signal of the CMOS inverter circuit IV1 is high level, the load MOSFET Q36 is turned on. Consequently in the NAND gate circuit, after the one shot pulse φ̄ is made high level, the DC current is not consumed through the drive MOSFET Q32~Q34 turned on. The second row decoder R-DCR2 may be a decoder of complete CMOS static type in place of the above-mentioned constitution.*

Although a concrete circuit is not shown, the first row decoder R-DCR1 forms four sorts of word line selective timing signals φ$_{x00}$ through φ$_{x11}$ from the word line selective timing signal φ$_x$ through a switch circuit composed of transmission gate MOSFET and cut MOSFET selected by decode signals formed by the complementary address signals a0, a1 of two bits in similar manner to the above description. These word line selective timing signals φ$_{x00}$ through φ$_{x11}$ are transmitted through the transmission gate MOSFET Q24~Q27 to each word line. Although not particularly limited, the row decoder R-DCR1 may be a decoder which performs the word line selective operation at receiving one shot pulse φ similar manner to the row decoder R-DCR2, or may be a decoder of complete CMOS static type similar to the above description.

Although not particularly limited, when the address signals a0 and a1 are made low level, the timing signal φ$_{x00}$ is made high level in synchronization with the timing signal φ$_x$. Also when the address signals a$_o$ and a$_l$, and $\bar{a}_o$ and $\bar{a}_l$, and $\bar{a}_o$ and $\bar{a}_l$ are made low level, the timing signals φ$_{xol}$, φ$_{xlo}$ and φ$_{xll}$ are made high level in synchronization with the timing signal φ$_x$.

Thereby the address signals a$_l$ and $\bar{a}_l$ are deemed as a sort of word line group selective signals to discriminate between a word line group corresponding to memory cells coupled with data line D (W$_o$, W$_1$, hereinafter referred to as "first word line group") among a plurality of word lines, and a word line group corresponding to memory cells coupled with data line D (W2, W3, hereinafter referred to as "second word line group").

In write operation of a dynamic type memory cell comprising an address selective MOSFET Qm and an information storing capacitor Cs as above described, in order to perform full write to the information storing capacitor Cs, in other words, in order to avoid the level loss of high level in writing to the information storing capacitor Cs due to threshold voltage of the address selective MOSFET Qm or the like, a word line bootstrap circuit BST started by the word line selective timing signal φ$_x$' is installed. The word line bootstrap circuit BST makes high level of the word line selective timing signal φ$_x$ higher than the power source voltage Vcc using the word line selective timing signal φ$_x$' and its delay signal.

The row decoder is divided in two, such as the row decoders R-DCR1 and R-DCR2, thereby pitch (distance) of the row decoder R-DCR2 can be registered with pitch of the word line. As a result, useless space is not produced on the semiconductor substrate. MOSFET Q20~Q23 are installed between each word line and the ground potential, and output of the NAND circuit is applied to gate of the MOSFET thereby the word line at non-selective state is fixed to the ground potential. Although not particularly limited, switch MOSFET Q38~Q41 are installed at remote side (opposite end to decoder side) of the word line. Timing signals $\overline{WC_{oo}} \sim \overline{WC_{ll}}$ in opposite phase to the timing signals φ$_{x00}$~φ$_{xll}$ are supplied to gate of the MOSFET Q38~Q41. Since the word line at non-selective state can be fixed to the ground potential of the circuit in this constitution, it can be prevented that the word line at non-selective state is elevated to intermediate potential corresponding to rising of the word line at selective state due to capacitive coupling between word lines. Address signals $\bar{a}_o \sim \bar{a}_l$ of X series supplied to the row decoders R-DCR1 and R-DCR2 are transmitted in output signals of the drive circuit DVR through a multiplexer MPX.

A column switch C-SW as exemplified in N-channel MOSFET Q42, Q43 selectively couples complementary data lines D0, $\overline{D0}$ with common complementary data lines CD, $\overline{CD}$. Selective signal from a column decoder as hereinafter described is supplied to gate of these MOSFET Q42, Q43.

The column decoder C-DCR is constituted by an address decoder circuit similar to the address decoder R-DCR2, and decodes address signals aj+1~a$_n$ supplied from the drive circuit DRV and forms selective signal to be supplied to the column switch C-SW in synchronization with data line selective timing signal $\phi_y$.

N-channel type precharge MOSFET Q44 to constitute a precharge circuit in similar manner to the above description is installed between the common complementary data lines CD, $\overline{CD}$. A pair of input/output nodes of a amplifier MA in similar circuit constitution to the unit sense amplifier USA are coupled also between the common complementary data lines CD, $\overline{CD}$. Output signal of the main amplifier MA is transmitted through a data output buffer DOB to the external terminal $D_{out}$. In read operation, the data output buffer DOB is at operation state according to timing signal $\overline{\phi rw}$, and amplifies the output signal of the main amplifier MA and transmits it out of the external terminal $D_{out}$. Also in write operation, output of the data output buffer DOB is made high impedance state by the timing signal $\phi_{rw}$.

Output terminals of a data input circuit DIB are coupled with the common complementary data lines CD, $\overline{CD}$. In write operation, the data input circuit DIB is at operation state according to timing signal $\phi_{rw}$, and transmits complementary write signal according to write signal $D_{in}'$ supplied from any of the registers $R_o$ through R3 to the complementary data lines CD, $\overline{CD}$ so as to perform write to a selected memory cell. Also in read operation, the output of the data input circuit DIB is made high impedance state by the timing signal $\phi_{rw}$.

Various timing signals as above described are formed by following internal control signal generating circuit TG. The internal control signal generating circuit TG forms various timing signals required for the memory operation and transmits them based on the shift clock SCK formed by the address signal variation detector ATD, and internal vhip selective signal cs formed by the control circuit CONT and killer signal XKL.

Circuit symbol REFC designates an automatic refresh circuit which includes a timer circuit TM and a refresh address counter or the like. In the automatic refresh circuit REFC, the timer circuit TM generates pulses to specify refresh period, and the refresh address counter counts the pulses thereby refresh address signals $a_o' \sim a_j'$ are generated. If the pulses are generated, refresh signal REF is generated and the memory access is interrupted, and further the refresh address signals $a_o' \sim a_j'$ are transmitted through the multiplexer MPX to the row decoders R-DCR1 and R-DCR2. For example, if the refresh signal REF is generated, the internal control signal generating circuit TG commands refresh operation after generating the end signal MED. Since the start signal MST is not generated before the refresh operation is finished, the memory access according to address signals taken in the registers Ro through R3 is waited.

In this embodiment, the above-mentioned automatic refresh circuit is contained thereby without being aware of its existence from outside, the memory access can be performed in similar manner to the static type RAM.

Figure 7:
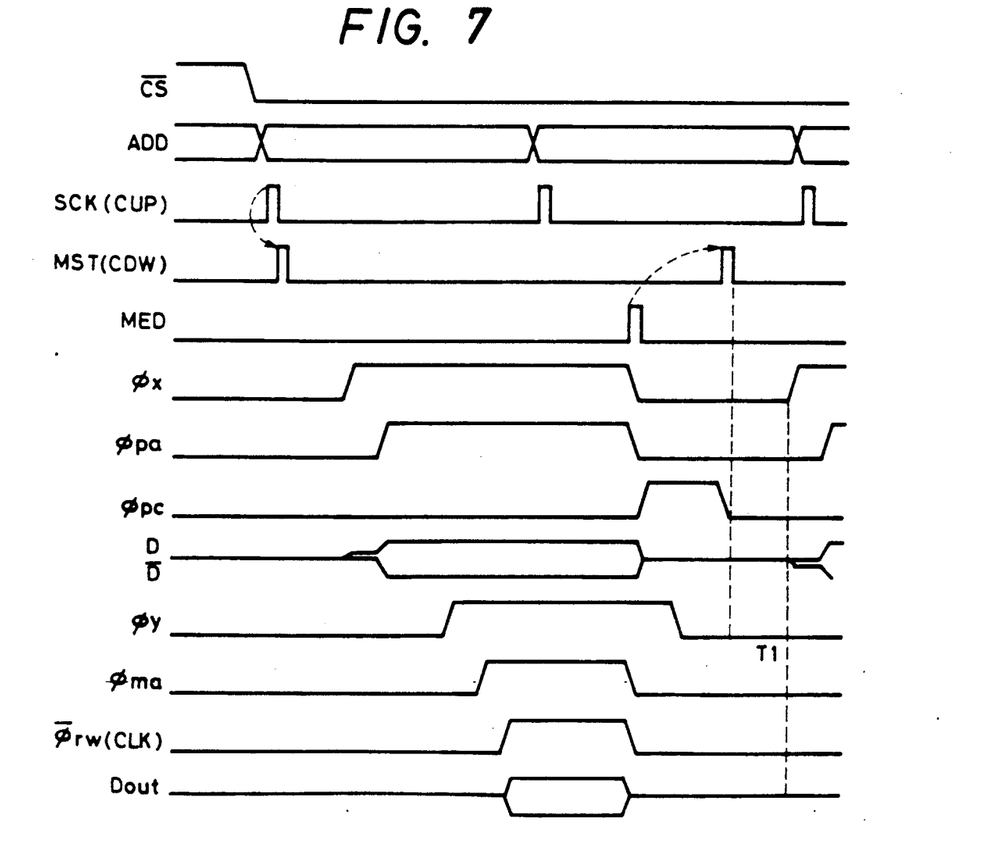
FIG. 7 is a timing chart illustrating an example of operation of the memory circuit shown in FIG. 6.

FIG. 7 shows a timing chart illustrating an example of operation of the memory circuit RAM.

If the chip selective signal $\overline{CS}$ becomes low level, the address buffer ADB becomes operation state and the address signal ADD from the external terminal is taken to inside. If any one of address signals supplied from the external terminal is varied, the address signal variation detector ATD detects the variation of address signal thereby the shift clock SCK is formed. The internal control signal generating circuit TG of the memory circuit RAM generates the start signal MST, because the internal chip selective signal cs according to low level of the chip selective signal $\overline{CS}$ is active level. Thereby the address decoder circuits R-DCR, C-DCR are supplied with address signals $a_o$ through an. The internal control signal generating circuit TG waits the operation time of the row decoders R-DCR1, R-DCR2, and elevates the word line selective timing signal $\phi_x$ to high level. One word line determined by address signals $a_o \sim a_j$ in synchronization with the rising of the word line selective timing signal $\phi_x$ rises to high level (not shown) and is made selective state. Thereby a plurality of memory cells coupled with the selected word line are selected, and the information storing capacitor of each memory cell is coupled with the data line D (or $\overline{D}$) through the address selective MOSFET. That is, input/output node of one memory cell of each of the complementary data lines D, $\overline{D}$ is coupled with one data line D (or $\overline{D}$). Thereby according to charge distribution of the storage charge of the memory cell and the precharge of the data line D, read level appears in the data line D (or $\overline{D}$). Other data line $\overline{D}$ (or D) remains at the precharge level because the memory cell is not coupled therewith.

Next, the timing pulse pa (In actual state, pa1 and pa2 are made high level in sequence as above described.) is made high level and the sense amplifier is operated. Thereby the complementary data lines D, D are amplified in low level and high level according to storage charge of the information storing capacitor Cs. Since the amplified signal by operation of the sense amplifier SA is transmitted to the memory cell, the memory information being lost can be rewritten (refresh operation).

Operation of the column decoder C-DCR is started according to the column switch selective timing signal $\phi_y$ delayed from the word line selective timing signal $\phi_x$. In other words, after the amplification operation of the sense amplifier SA, the column selective operation is started and the column switch C-SW is selected In reading that the write enable signal $\overline{WE}$ is made high level according to the timing pulses $\phi_{ma}, \phi hd\ rw$ generated in time series, the main amplifier MA and the data output buffer DOB are operated, and in synchronization therewith the clock signal CLK and the output signal $D_{out}$ are transmitted. Although not shown, in writing that the write enable signal $\overline{WE}$ is made low level, the data input circuit DIB is operated in place of the data output buffer DOB.

The end signal MED is formed by ending of the above-mentioned operation. According to the end signal MED, at normal operation cycle, each timing signal is reset, and the precharge signal $\phi_{pc}$ is made high level and the precharge operation (reset operation of internal selective circuit) is performed. On the basis of the end signal MED, the internal control signal generating circuit TG generates the start signal MST after time lapse required for the precharge time. That is, in the internal control signal generating circuit TG, only initial starting is performed by the shift clock SCK, and subsequently signals are generated automatically based on the end signal MED. Consequently, even if new address signal ADD is inputted during the memory access period and therefore the shift clock SCK is generated, operation of the memory circuit RAM has no relation to this.

If the killer signal XKL is generated by the address comparator XAC, the internal control signal generating circuit TG maintains the word line selective timing signal $\phi_x$ or the timing pulse $\phi_{pa}$ of the sense amplifier SA at high level and also maintains the precharge signal $\phi_{pc}$ at low level, and further nullifies the reset operation of the selective circuit of row series. In other words, the selective operation of the word line is continued. Thereby at next operation cycle, the start signal MST comes and the data selective timing signal $\phi_y$ rises early at the rising timing $T_1$ of the word line thereby the selective operation of column series is started. Thereby the memory access to the same X address can be performed at high speed.

If the refresh signal REF is generated during the memory access, the end signal MED is generated and process is transferred to the refresh operation. That is, the internal control signal generating circuit TG inhibits generation of the start signal MST by the refresh signal REF, and generates timing signals ($\phi_x$, $\phi_{pa}$) of row series at inside according to the end signal MED. Thereby the refresh operation is performed. In the internal control signal generating circuit TG, since the start signal MST is generated after ending of the refresh operation, the memory access is performed again. In such simple constitution, the memory access accompanying with the refresh operation can be interrupted.

Effects obtained from the above-mentioned embodiments are as follows.

(1) A plurality of registers to take a plurality of address signals inputted at asynchronous state are installed, and memory access is performed according to sequence of the address signals taken in the plurality of registers. Accordingly, a microprocessor or the like to perform the memory access can supply the address signal for the memory access according to its own operation speed irrespective of operation speed of the memory, and the memory can output data according to the taken address signal and to its own operation speed thereby efficient memory access can be realized.

(2) Address signals for continuous memory access are taken in a register, and from comparison operation of the address signals, for example, when access of memory cells coupled with the same word line is performed, selective operation of the word line can be omitted. Thereby the memory circuit can be operated at high speed.

(3) When the invention is applied to a buffer memory for data transfer between microprocessors being different in the operation speed according to above item (1), throughput of the system can be improved.

(4) Corresponding bits of a plurality of registers to take address signals are connected in cascade and constituted in a shift register, and up/down counter circuit is used as its selective circuit and selective operation of the register is performed by the decode output. Accordingly, one circuit can select a register for address input and perform register selective operation for memory access, thereby the register selective circuit is simplified, and the register contention detector and the operation circuit detecting the memory access to the same X address are also simplified.

Although the invention made by the inventor has been concretely described based on the embodiments, the invention is not limited to the embodiments but various changes may be made without departing the spirit thereof. For example, address signal may be supplied according to timing signal. In this case, the address signal variation detector becomes unnecessary. Also chip selective signal may be omitted, and according to the timing signal or address signal variation detecting signal, taking of address signal or memory access operation according to the taken address signal may be performed.

In FIG. 3, when the registers R0~R3 are constituted in a shift register, shift clock pulses of two phases may be used. In this case, the shift clock of two phases may be formed using variation detecting pulse formed by the address signal detector ATD and delay signal thereof.

Reference voltage required for the read operation of the memory cell of the memory circuit RAM (dynamic type RAM) shown in FIG. 6 may be formed using a dummy cell. Concrete circuit constitution of other peripheral circuits to constitute the dynamic type RAM may take various embodying forms. For example, the number of memory arrays or memory mats may take various embodying forms corresponding to the memory capacity or the operation speed.

The memory circuit is not limited to the dynamic type RAM or the static type RAM as above described, but ROM (read only memory) may be used. In this case, since only the read operation is performed except a writable ROM such as EPROM or EEPROM, a register to take the write signal becomes unnecessary. The number of registers to take address signals is not limited to four as above described, but may be increased as much as possible thereby more efficient memory access can be performed.

The memory may be a memory device of board constitution where a memory circuit, a register to take address signals, a register selective circuit and a control circuit are constituted by semiconductor integrated circuit respectively.

The invention can be widely utilized in a memory used in microcomputer system, a buffer memory used in data transfer between processors in multi microprocessor constitution, or a memory device for data communication between devices having different bit rate.

Effects obtained by typical invention disclosed in the application will be briefly described as follows. That is, a plurality of registers are installed to take a plurality of address signals inputted in asynchronous state, and the memory access is performed according to sequence of the address signals taken in these plural registers, thereby a microprocessor or the like to perform the memory access can supply address signals for the memory access according to its own operation speed irrespective of operation speed of the memory, and since the memory can output data according to the taken address signals and to its own operation speed, efficient memory access can be realized.

What is claimed is:
1. A semiconductor memory comprising:
  a memory cell array;
  external address terminals to be supplied with first address signals for designating a first memory cell and second address signals for designating a second memory cell;
  first memory means for storing said first address signals;
  second memory means for storing said second address signals;
  an external data terminal to be supplied with output data; and
  means for supplying first data being stored in said first memory cell and second data being stored in said second memory cell to said external data terminal;
  wherein said external address terminals are supplied with said first address signals before said second address signals, and wherein said second address signals supplied to said external address terminals are stored in said second memory means before said external data terminal is supplied with said first data.

2. A microprocessor system including a semiconductor memory for storing data and a microprocessor for supplying address signals to said semiconductor memory, said semiconductor memory comprising:

a memory cell array;

external address terminals to be supplied with first address signals for designating a first memory cell and second address signals for designating a second memory cell;

first memory means for storing said first address signals;

second memory means for storing said second address signals;

an external data terminal to be supplied with output data; and means for supplying first data being stored in said first memory cell and second data being stored in said second memory cell to said external data terminal;

wherein said external address terminals are supplied with said first address signals before said second address signals, and wherein said second address signals supplied to said external address terminals are stored in said second memory means before said external data terminal is supplied with said first data.

3. A method of reading out data stored in a semiconductor memory having external address data terminal to be supplied with said data and memory means for storing said address signals, comprising the steps of:

supplying first address signals for designating a first memory cell in said semiconductor memory to said external address terminals;

supplying second address signals for designating a second memory cell in said semiconductor memory to said external address terminals after the step of supplying first address signals for designating a first memory cell in said semiconductor memory to said external address terminals;

reading first data being stored in said first memory cell on the basis of said first address signals;

storing said second address signals in said memory means; and supplying said first data to said external data terminal after the step of storing said second address signals in said memory means.

4. A method according to claim 3, further comprising the steps of:

supplying third address signals for designating a third memory cell in said semiconductor memory to said external address terminals after the step of supplying second address signals for designating a second memory cell in said semiconductor memory to said external address terminals;

storing said third address signals in said memory means;

reading second data being stored in said second memory cell on the basis of said second address signals; and supplying said second data in said external data terminal after the step of storing said third address signals in said memory means.

5. A method according to claim 3, further comprising the steps of:

reading second data being stored in said second memory cell on the basis of said second address signals; and supplying said second data to said external data terminal after the step of supplying said first data to said external data terminal successively.

* * * * *